(12) United States Patent
Maruyama

(10) Patent No.: US 7,446,361 B2
(45) Date of Patent: Nov. 4, 2008

(54) CAPACITOR AND SEMICONDUCTOR DEVICE HAVING A FERROELECTRIC MATERIAL

(75) Inventor: Kenji Maruyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/121,054

(22) Filed: May 4, 2005

(65) Prior Publication Data

US 2005/0190589 A1 Sep. 1, 2005

Related U.S. Application Data

(62) Division of application No. 10/718,726, filed on Nov. 24, 2003, now Pat. No. 6,943,080.

(30) Foreign Application Priority Data

Dec. 10, 2002 (JP) .............................. 2002-358093

(51) Int. Cl.
*H01L 31/119* (2006.01)

(52) U.S. Cl. .................. 257/295; 257/298; 257/627; 257/628; 257/E21.009; 257/E21.664

(58) Field of Classification Search ................ 257/303, 257/306, 307, 308, 295, 298, 627
See application file for complete search history.

(56) References Cited

U.S. PATENT DOCUMENTS

| 5,434,742 | A  | * | 7/1995 | Saito et al. ............... 361/321.5 |
| 6,720,599 | B2 | * | 4/2004 | Higuchi et al. ............. 257/295 |
| 2002/0025453 | A1 | * | 2/2002 | Tatsumi ...................... 428/697 |
| 2002/0173097 | A1 | * | 11/2002 | Choi .......................... 438/253 |

FOREIGN PATENT DOCUMENTS

| JP | 2584639 | | 11/1996 |
| JP | 8-340087 | | 12/1996 |
| JP | 08-340087 | * | 12/1996 |
| JP | 2738012 | | 1/1998 |
| JP | 11-103024 | | 4/1999 |
| JP | 2001-102543 | | 4/2001 |

* cited by examiner

*Primary Examiner*—Dao H Nguyen
(74) *Attorney, Agent, or Firm*—Westerman, Hattori, Daniels & Adrian, LLP.

(57) ABSTRACT

A capacitor includes a pair of electrodes and a ferroelectric film sandwiched between the electrodes. The electrodes are provided perpendicular to the direction of the polarization axis of the ferroelectric film.

8 Claims, 9 Drawing Sheets

CAPACITOR AND SEMICONDUCTOR DEVICE HAVING A FERROELECTRIC MATERIAL

CROSS-REFERENCE TO RELATED APPLICATION

This application is a Divisional of application Ser. No. 10/718,726, filed Nov. 24, 2003 now U.S. Pat. No. 6,943,080. The present application is based on Japanese Laid-Open Patent Application No. 2002-358093, filed on Dec. 10, 2002, the entire contents of which are hereby incorporated by reference.

BACKGROUND OF THE INVENTION

1. Field of the Invention

The present invention generally relates to a capacitor, a semiconductor device including the capacitor, and a method of manufacturing the semiconductor device, and more particularly to a nonvolatile semiconductor storage device including a capacitor using a ferroelectric material as a dielectric.

2. Description of the Related Art

Some semiconductor devices, particularly, semiconductor memories, have a variety of properties. The semiconductor memories are roughly classified into volatile memories that lose information stored therein when power is turned off and nonvolatile memories that retain information stored therein when power is turned off. A nonvolatile memory that retains data in a capacitor using a ferroelectric material as a dielectric is referred to as a ferroelectric random access memory (FRAM®).

The FRAM uses the two remanent polarization properties of different polarities of a ferroelectric material so as to retain data when power is turned off and no electric field is applied across the capacitor. The FRAM can rewrite data $10^{10}$~$10^{12}$ times, which is far more than the number of times ($10^6$) a flash memory can rewrite data. The FRAM can rewrite data at high speed in tens of nanoseconds.

In the FRAM, the ferroelectric material, which is material for the dielectric of the capacitor, is polarized in one of two directions upon application of an electric field, and remains polarized in the same direction even after removing the electric field. Data of logical "1" and "0" corresponding to one and the other, respectively, of the polarization directions can be recorded in the FRAM by distinguishing between the polarization directions. Further, the polarization direction can be switched from one to the other by applying a sufficient electric field in the direction opposite to the polarization direction.

Typical ferroelectrics include lead-based ferroelectrics such as $PbZr_{1-x}Ti_xO_3$ ($0 \leq x \leq 1$) (PZT) and $Pb_{1-y}La_yZr_{1-x}Ti_xO_3$ ($0 \leq x, y \leq 1$) (PLZT) and bismuth-based ferroelectrics such as $SrBiTa_2O_9$ (SBT).

Generally, in PZT, remanent polarization is reduced as the reversal of polarization is repeated, causing property degradation (fatigue phenomenon). Meanwhile, the FRAM, which uses one of such ferroelectrics, is employed in apparatuses handling personal or money information, such as IC cards. Accordingly, the FRAM is required to be highly reliable. In order to realize the expected durable period of ten years, it is desirable that the FRAM have a larger remanent polarization charge.

However, most conventional ferroelectric capacitors manufactured by spattering or the sol-gel method have a remanent polarization charge of 20-25 $\mu C/cm^2$. Only tens of percents of the conventional ferroelectric capacitors satisfy a remanent polarization charge of 30 $\mu C/cm^2$ required for a product. FIG. 1 is a diagram showing a conventional ferroelectric capacitor 100 of the FRAM. Referring to FIG. 1, the ferroelectric capacitor 100 is formed by successively layering a Pt film 101 as a lower electrode, a PZT film 102 that is a ferroelectric film, and a Pt film 103 as an upper electrode in the order described on, for instance, a contact plug connected to a diffusion region of a transistor. The lower-electrode Pt film 101 is oriented in the [111] direction toward the direction of film thickness by its self-orientation characteristic. The PZT film 102 formed on the Pt film 101 is oriented in the [111] direction, affected by the orientation of the Pt film 101. Since the PZT film 102 has a polarization axis in the [001] direction, the direction of the electric field applied between the lower-electrode Pt film 101 and the upper-electrode Pt film 103 differs from the direction of the polarization axis of the PZT film 102. This results in the problem that an electric charge usable as remanent polarization decreases naturally.

SUMMARY OF THE INVENTION

Accordingly, it is a general object of the present invention to provide a capacitor in which the above-described disadvantage is eliminated.

A more specific object of the present invention is to provide a capacitor that can acquire a greater remanent polarization charge, a semiconductor device including the same, and a method of manufacturing such a semiconductor device.

One or more of the above objects of the present invention are achieved by a capacitor including a pair of electrodes and a ferroelectric film sandwiched between the electrodes, wherein the electrodes are provided perpendicular to a direction of a polarization axis of the ferroelectric film.

According to the above-described capacitor, the electrodes are provided perpendicular to the direction of the polarization axis of the ferroelectric film. Accordingly, the charge of the maximum remanent polarization of the ferroelectric film may be obtained.

One or more of the above objects of the present invention are achieved by a semiconductor device including: a semiconductor substrate; and a capacitor provided on the semiconductor substrate, the capacitor including a pair of electrodes and a ferroelectric film sandwiched therebetween, wherein the electrodes are provided perpendicular to a direction of a polarization axis of the ferroelectric film.

One or more of the above objects of the present invention are also achieved by a semiconductor device including: a semiconductor substrate; a transistor formed on the semiconductor substrate, the transistor including a gate electrode and a diffusion region; a first interlayer insulating film covering the semiconductor substrate and the transistor; a second interlayer insulating film formed on the first interlayer insulating film; and a capacitor formed in the second interlayer insulating film, the capacitor including a pair of electrodes and a ferroelectric film sandwiched therebetween, wherein the electrodes are provided perpendicular to a direction of a polarization axis of the ferroelectric film.

According to the above-described semiconductor devices, the electrodes are provided perpendicular to the direction of the polarization axis of the ferroelectric film in the capacitor. Accordingly, the maximum remanent polarization of the ferroelectric film can be extracted. Therefore, the above-described semiconductor devices have tolerance to the degradation of a remanent polarization charge and have a high signal-to-noise ratio at the time of reading out information. Accordingly, the reliability of the semiconductor devices can be increased.

The above objects of the present invention are further achieved by a method of manufacturing a semiconductor device including a capacitor including a pair of electrodes and a ferroelectric film with ferroelectricity sandwiched therebetween, the method including the steps of: (a) depositing the ferroelectric film on a first substrate; (b) forming the capacitor by grinding the ferroelectric film and forming the electrodes so that the electrodes are perpendicular to a direction of a polarization axis of the ferroelectric film; (c) forming a first interlayer insulating film covering a surface of the first substrate and the capacitor; (d) forming a transistor on a second substrate, the transistor including a gate electrode and a diffusion region; (e) forming a second interlayer insulating film covering a surface of the second substrate and the transistor; (f) flattening surfaces of the first and second interlayer insulating films by chemical mechanical polishing; (g) integrating the first and second substrates by joining the flattened surfaces of the first and second interlayer insulating films; and (h) removing the first substrate.

According to the above-described method, since the ferroelectric film of the capacitor is formed on the single-crystal substrate, the ferroelectric film may be formed epitaxially thereon. Therefore, the ferroelectric film can be formed with excellent crystalline quality with a fixed crystal orientation. Further, in the semiconductor device, the capacitor is formed in a process independent of the process of forming the transistor. Accordingly, a wide range of tolerance can be set for the conditions for forming the capacitor, such as a temperature condition, so that the ferroelectric film may be formed with better crystallinity. As a result, the reliability of the semiconductor device can be increased.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

First, a brief description is given of the principles of the present invention.

Figure 1:
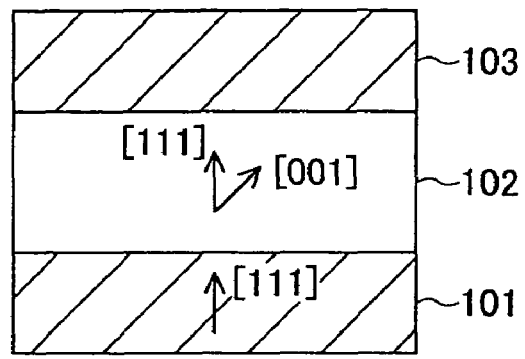
FIG. 1 is a diagram showing a conventional ferroelectric capacitor of a FRAM.
Figure 2:
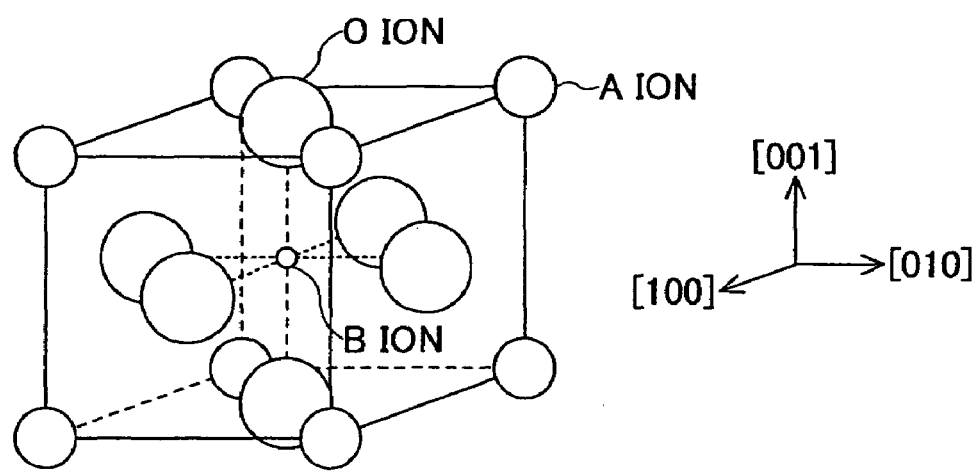
FIG. 2 is a diagram showing a perovskite structure.

In the following, the case of using a perovskite oxide (an oxide having a perovskite structure) as the ferroelectric film of a ferroelectric capacitor is described as an example. Generally, a perovskite oxide is expressed by the general formula $ABO_3$. FIG. 2 is a diagram showing a perovskite structure. Referring to FIG. 2, in an ideal perovskite structure, a unit lattice is a cube with A ions being disposed at the vertexes, a B ion at the body center, and C ions at the face centers. In this structure, the large-size A and O ions form a cubic closest packing structure with the small-size B ion being in the space formed therein. If the oxide is PZT, the A ions are $Pb^{2+}$ and the B ions are $Zr^{4+}$ and $Ti^{4+}$. The spontaneous polarization of a ferroelectric is caused by asymmetrical displacement of the B ions, which are small and mobile, and is reversible by an external electric field. The B ions are most displaceable in the [001] direction. As a result, remanent polarization is maximized in the [001] direction. Accordingly,. when the electrodes of the ferroelectric capacitor are disposed perpendicular to the [001] direction of the ferroelectric film, that is, disposed on the (001) plane, the maximum remanent polarization can be extracted as a signal charge.

Figure 3:
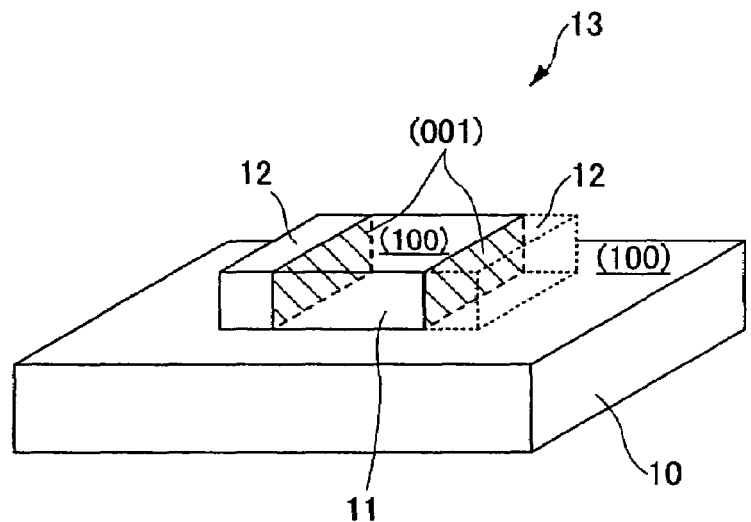
FIG. 3 is a diagram for illustrating the principles of the present invention.

FIG. 3 is a diagram for illustrating the principles of the present invention. Referring to FIG. 3, a ferroelectric film 11 such as a PZT film is epitaxially grown on the (100) surface of, for instance, a MgO single-crystal substrate 10 so that the (100) surface of the ferroelectric film 11 grows. Accordingly, the ferroelectric film 11 has the [001] direction perpendicular to the direction of its growth. Therefore, by exposing two (001) surfaces by etching, and forming electrodes 12 by depositing conductive material by spattering, a ferroelectric capacitor 13 having the electrodes 12 provided perpendicular to the direction of the polarization axis (the [001] direction) is formed. Accordingly, the ferroelectric capacitor 13 can extract a maximum remanent polarization.

Further, according to the present invention, the ferroelectric capacitor 13 formed on the single-crystal substrate 10 is disposed on a silicon substrate on which a transistor is formed. The ferroelectric capacitor 13 is disposed on the transistor substrate by first joining the substrate 10 and the transistor substrate together and then removing the substrate 10.

It is possible to grow a ferroelectric film such as a PZT film epitaxially on a silicon transistor substrate. It is impossible, however, to form the ferroelectric film on the surface of the silicon substrate or a silicon oxide film (not limited to amorphous material or a polycrystalline substance) formed on the surface of the silicon substrate so that the [001] direction of the ferroelectric film is parallel to the main surface of the silicon substrate. That is, it is impossible to expose (001) surfaces of the ferroelectric film and form electrodes on the exposed (001) surfaces. Meanwhile, it is possible to grow a buffer layer of, for instance, magnesia spinel, epitaxially on the silicon substrate, and grow a ferroelectric film on the buffer layer. However, heating at temperatures as high as 900° C. or over is required to form the buffer layer, and the heating causes the problem of a change in the impurity distribution of the diffusion regions of the transistor.

Therefore, according to the present invention, a ferroelectric capacitor is previously formed on a single-crystal substrate, and the ferroelectric capacitor is disposed by joining the single-crystal substrate and a silicon substrate that is to serve as a semiconductor device.

Next, a description is given, with reference to the accompanying drawings, of an embodiment of the present invention.

Figure 4:
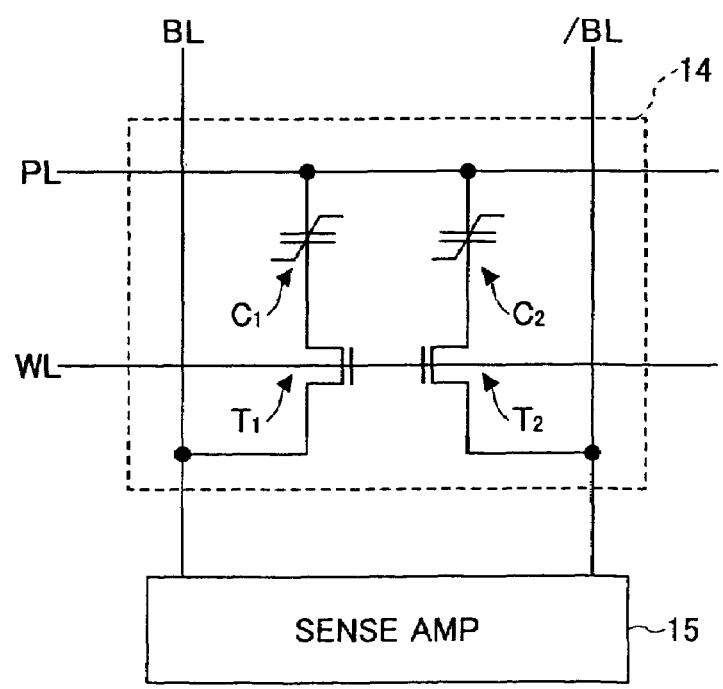
FIG. 4 is a diagram showing an equivalent circuit of a FRAM according to an embodiment of the present invention.

FIG. 4 is a diagram showing an equivalent circuit of a FRAM 20 according to an embodiment of the present invention. Referring to FIG. 4, a memory cell 14 has a so-called 2T2C-type structure using two transfer transistors $T_1$ and $T_2$ and two ferroelectric capacitors $C_1$ and $C_2$ in order to record one-bit information. The memory cell operates complementarily, recording information "0" and "1" in one and the other, respectively, of the ferroelectric capacitors $C_1$ and $C_2$. Specifically, information is written as follows. The transfer transistors $T_1$ and $T_2$ are turned on by a word line WL, and information "0" or "1" is input to a bit line BL and information "1" or "0" is input to a complementary bit line /BL, so that complementary information is written to the ferroelectric capacitors $C_1$ and $C_2$. The written information is retained as the polarization directions of the ferroelectric -films of the ferroelectric capacitors $C_1$ and $C_2$. Information is read out as follows. When the transfer transistors $T_1$ and $T_2$ are turned on by the word line WL, voltages due to the remanent polarization of the ferroelectric capacitors $C_1$ and $C_2$ are applied to the bit line BL and the complementary bit line /BL. Then, a sense amplifier 15 detects the difference in voltage between the bit lines BL and /BL, so that the information stored in the ferroelectric capacitors $C_1$ and $C_2$ is read out.

Figure 5:
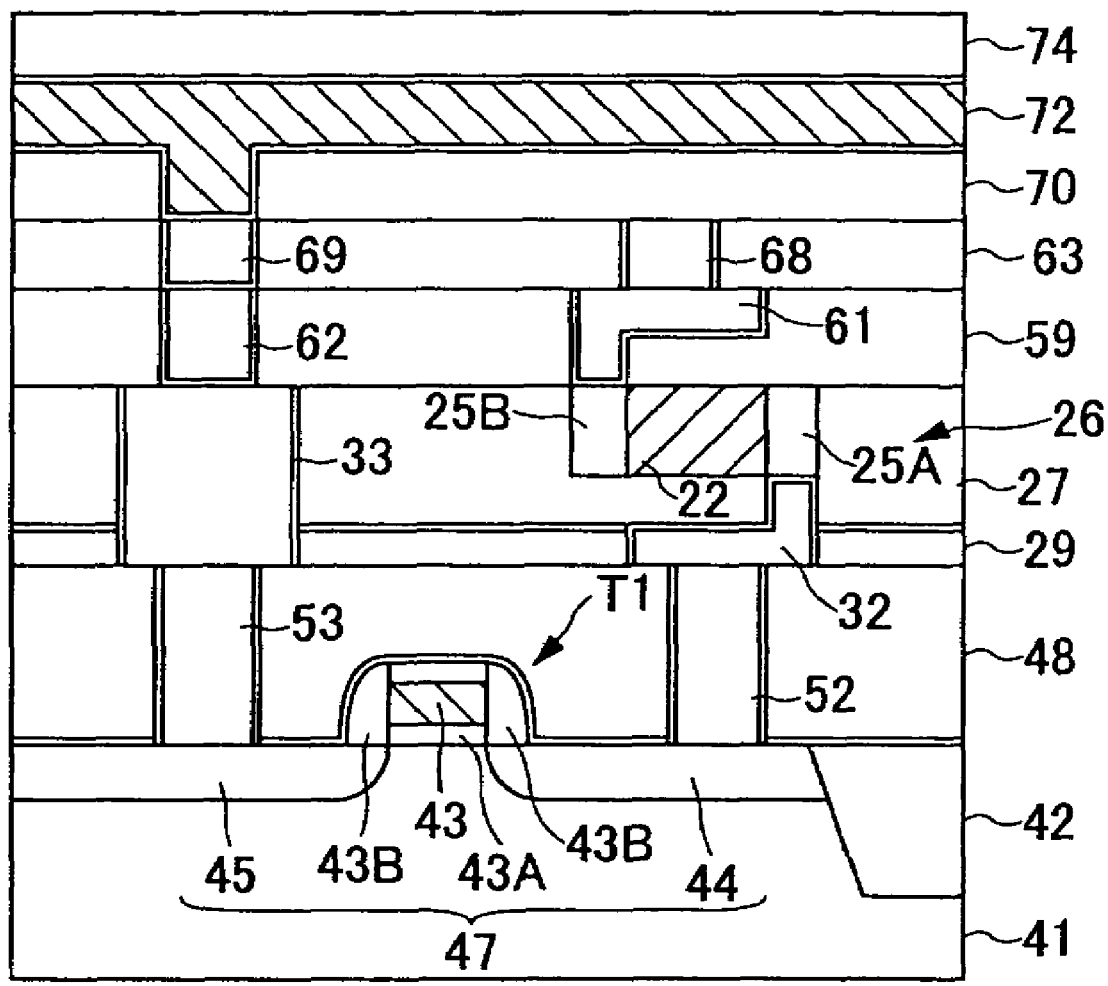
FIG. 5 is a sectional view of the FRAM according to the embodiment of the present invention.

FIG. 5 is a sectional view of the FRAM 20 according to the embodiment of the present invention. FIG. 5 shows a section of the FRAM 20 including the ferroelectric capacitor $C_1$ and the transfer transistor (hereinafter referred to simply as a transistor) $T_1$ along the bit line BL of the memory cell 14 of FIG. 4.

Referring to FIG. 5, the FRAM 20 includes: a semiconductor substrate 41; the transistor $T_1$ formed of a gate electrode 43 serving as a word line (the word line WL in FIG. 4) and source/drain regions 44 and 45 on the semiconductor substrate 41; an interlayer insulating film 48 covering the semiconductor substrate 41 and the transistor $T_1$; an interlayer insulating film 27 formed on the interlayer insulating film 48; the ferroelectric capacitor $C_1$ (referred to by reference numeral 26) formed of electrodes 25A and 25B and a ferroelectric film 22 sandwiched therebetween in the interlayer insulating film 27; a contact plug 52 and a via plug 32 that connect the source/drain region 44 and the electrode 25A; a via plug 61 that connects the electrode 25B and a planar line 68; and a contact plug 53 and via plugs 33, 62, and 69 that connect the source/drain region 45 and the bit line BL (referred to by reference numeral 72).

A well-know silicon substrate is employed as the semiconductor substrate 41. In the semiconductor substrate 41, an isolation film 42 is formed by STI (Shallow Trench Isolation) or LOCOS (Local Oxidation of Silicon) so that a device region 47 is formed and defined. In the device region 47, the source/drain regions 44 and 45 and the gate electrode 43 as a word line on a gate oxide film 43A are covered with films including a sidewall insulating film 43B so that the transistor $T_1$ is formed. The gate electrode 43 extends in a direction perpendicular to the section of the FRAM 20 shown in FIG. 5.

Figure 6A:
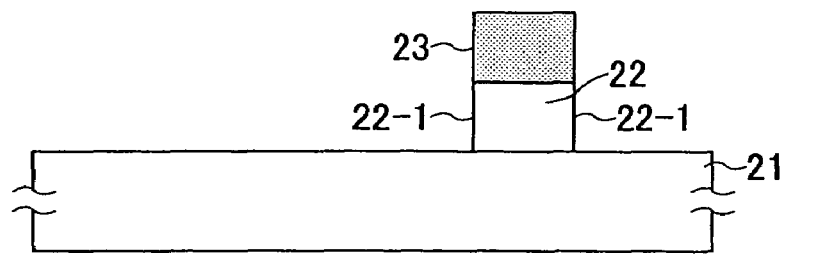
FIGS. 6A through 6K are diagrams showing a process of manufacturing the FRAM according to the embodiment of the present invention.

The electrode 25A of the ferroelectric capacitor 26 is connected to the source/drain region 44 through the via plug 32 and the contact plug 52. The electrode 25B of the ferroelectric capacitor 26 is connected to the planar line 68 through the via plug 61. The ferroelectric capacitor 26 is disposed so that a direction perpendicular to the surfaces of the electrodes 25A and 25B which surfaces are in contact with the ferroelectric film 22 is parallel to the main surface of the semiconductor substrate 41. A detailed description is given below of a method of forming the ferroelectric film 22. The ferroelectric film 22 is initially formed on a single-crystal substrate different from the semiconductor substrate 41 (as shown in FIG. 6A). The single-crystal substrate is, for instance, a MgO single-crystal substrate having a (100) main surface, and the ferroelectric film 22 is grown epitaxially on the single-crystal substrate.

Further, the electrodes 25A and 25B are disposed perpendicular to the direction of the polarization axis of the ferroelectric film 22. For instance, when the ferroelectric film 22 is a perovskite oxide, the ferroelectric film 22 has its polarization axis in the [001] direction. Accordingly, the electrodes 25A and 25B are provided perpendicular to the [001] direction, that is, the electrodes 25A and 25B are provided on (001) surfaces of the ferroelectric film 22.

A crystal having, for instance, a perovskite structure, a bismuth layer structure, or a tungsten bronze structure is employable as the ferroelectric film 22. Typical crystals with a perovskite structure include PZT expressed by the general formula $PbZr_{1-x}Ti_xO_3$ ($0 \leq x \leq 1$), PLZT expressed by the general formula $Pb_{1-y}La_yZr_{1-x}Ti_xO_3$ ($0 \leq x, y \leq 1$), and a crystal expressed by the general formula $Pb(B'_{1/3}B''_{2/3})_xTi_yZr_{1-x-y}O_3$ ($0 \leq x, y \leq 1$, B': bivalent metal, B'': pentavalent metal) or $Pb(B'_{1/2}B''_{1/2})_xTi_yZr_{1-x-y}O_3$ ($0 \leq x, y \leq 1$, B': trivalent metal, B'': hexavalent metal). The latter two crystals are preferable to PZT because the remanent polarization of each of the latter two crystals is greater than that of PZT.

Crystals with a bismuth layer structure include $SrBiTa_2O_9$ (SBT) and $BiLaTi_3O_{12}$ (BLT). Crystals with a tungsten bronze structure include $Ba_2NaNb_3O_{15}$ and $Ba_{1-x}Sr_xNb_2O_6$.

The electrodes 25A and 25B of the ferroelectric capacitor 26 are, for instance, 200 nm in thickness. The material of the electrodes 25A and 25B may be selected from the platinum group elements of Pt, Ru, Rh, Pd, Os, and Ir, Ti, their alloys, and a group of conductive oxides such as $IrO_2$, $RuO_2$, $SrRuO_3$, $CaRuO_3$, $LaRuO_3$, $La_xSr_{1-x}CoO_3$ ($0 \leq x \leq 1$), and $La_xSr_{1-x}MnO_3$ ($0 \leq x \leq 1$). The electrodes 25A and 25B may have a layer structure of two or more of the above-described materials. For instance, Ir/$IrO_2$ may be employed so that each of the electrodes 25A and 25B has a conductive oxide layer on the ferroelectric film 22 side. The repeated polarization reversal of the ferroelectric film 22 may cause a lattice defect such as oxygen deficiency at the interfaces between the ferroelectric film 22 and the electrodes 25A and 25B, thus resulting in the degradation of the remanent polarization of the ferroelectric film 22. The formation of a conductive oxide layer between the ferroelectric film 22 and each of the electrodes 25A and 25B can control the degradation of the remanent polarization of the ferroelectric film 22, thus increasing reliability.

Further, according to the present invention, there is no need to epitaxially grow the ferroelectric film 22 on the electrodes 25A and 25B. Accordingly, the electrodes 25A and 25B may be a metal such as W, Al, or Cu. Thus, the material of the electrodes 25A and 25B may be selected from a wide range.

Next, a description is given of a method of forming the FRAM 20 according to the embodiment of the present invention.

Figure 6B:
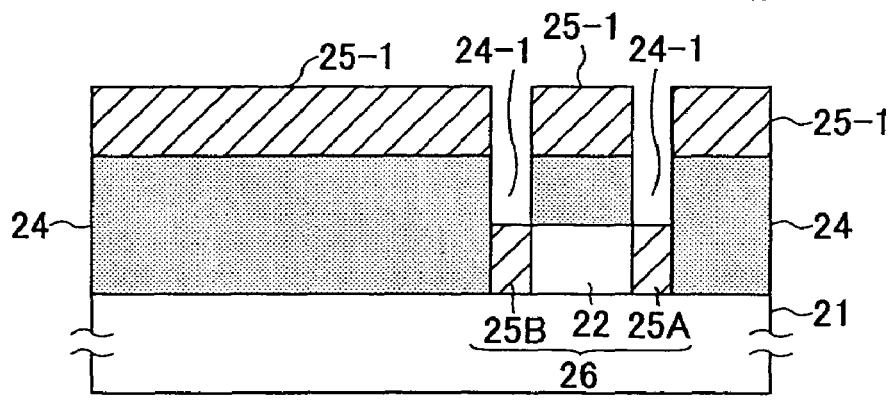
Figure 6C:
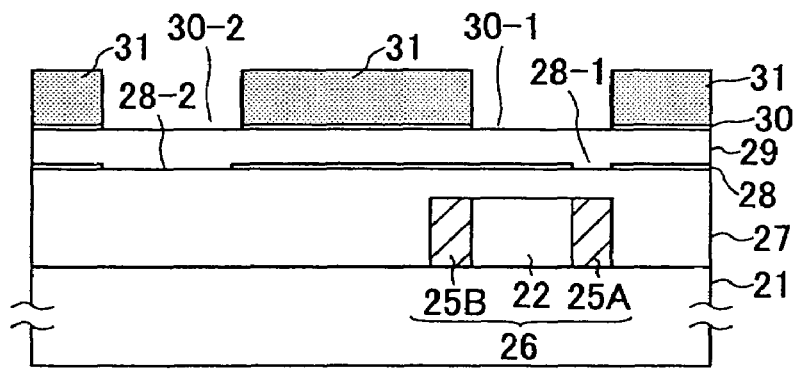
Figure 6D:
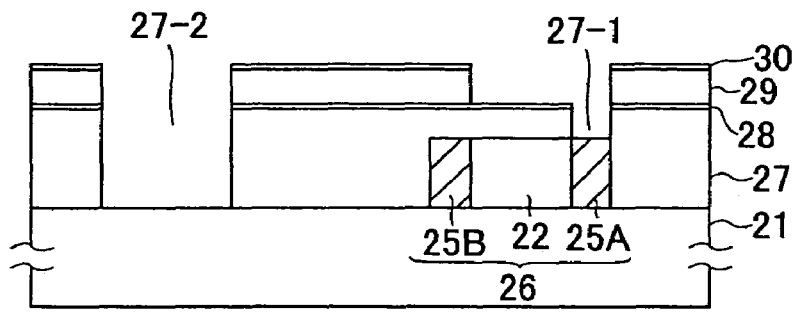
Figure 6E:
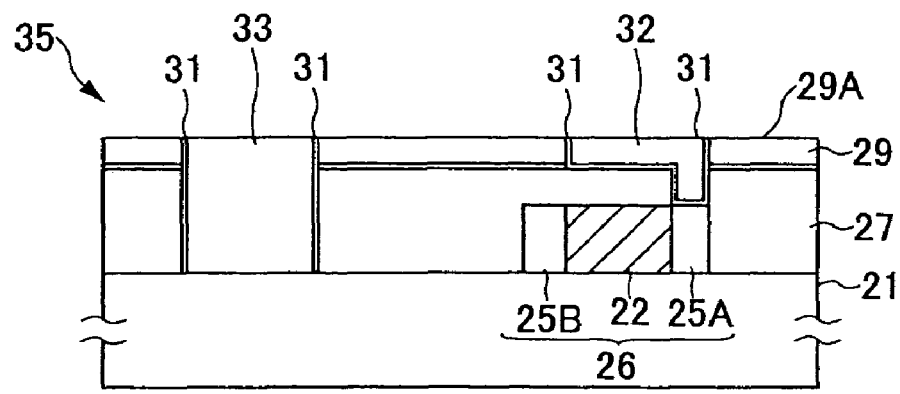
Figure 6F:
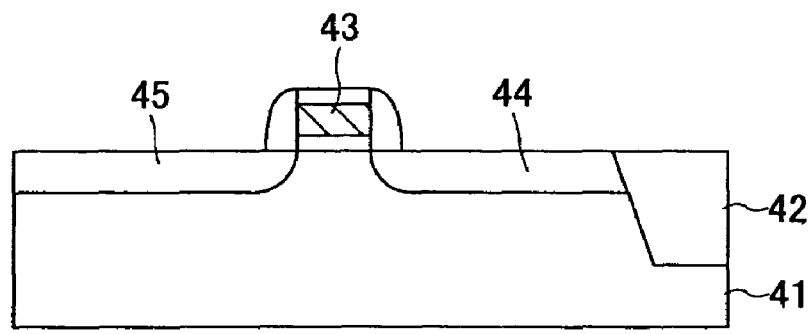
Figure 6G:
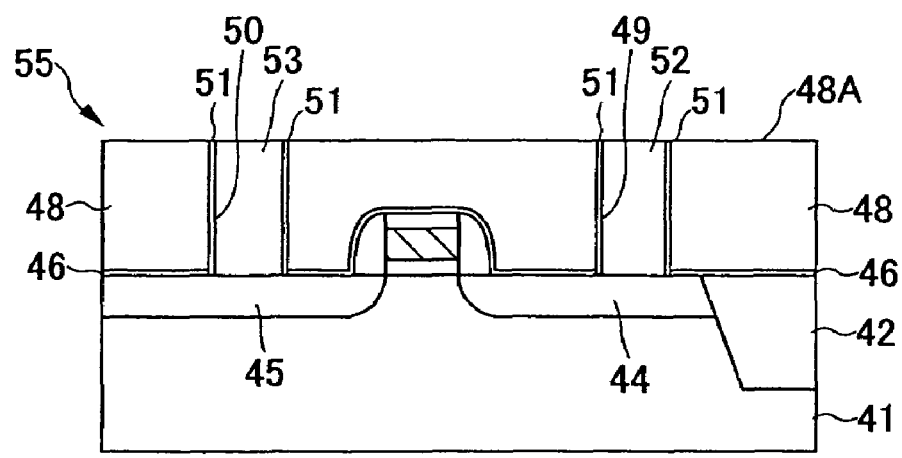

FIGS. 6A through 6K are sectional views for illustrating a method of forming the FRAM 20 according to the embodiment. FIGS. 6A through 6E show the process of forming the ferroelectric capacitor 26 on a single-crystal substrate 21. FIGS. 6F and 6G show the process of forming the transistor $T_1$ on the semiconductor substrate 41 of the FRAM 20. FIGS.

6H through 6K show the process of forming the FRAM 20 by joining the single-crystal substrate 21 and the semiconductor substrate 41 together.

In the process of FIG. 6A, the ferroelectric film 22 such as a PZT film is epitaxially grown on the (100) surface of the single-crystal substrate 21 such as a MgO substrate. Specifically, the (100) surface of MgO is cleaned, and then the PZT film 22 is epitaxially grown on the (100) surface of the MgO substrate 21. The PZT film 22 may be formed by metalorganic chemical vapor deposition (MOCVD), molecular beam epitaxy (MBE), pulsed laser deposition (PLD), or the sol-gel method. The following description is given of the case of using the sol-gel method. Approximately 0.3 cm$^3$ of a PZT thin film forming agent (PZT 113/45/55, of a concentration of 15 weight %) to which Pb is excessively added is dropped on the MgO substrate 21, and the MgO substrate 21 is rotated at 3000 rpm for 20 seconds. PZT 113/45/55 indicates that the molar concentration ratio of Pb to Zr to Ti is 113:45:55. Next, the MgO substrate 21 on which the PZT thin film forming agent has been applied is heated on a hot plate at 350° C. for one minute so that the solvent of the PZT thin film forming agent is volatilized. Then, the MgO substrate 21 is cooled to room temperature. The single-crystal substrate 21 is not limited to a MgO substrate, which may be replaced by a SrTiO$_3$ substrate, a sapphire substrate, or a magnesia spinel (MgAl$_2$O$_4$) substrate. The crystal surfaces of these single-crystal substrates are not limited to the above-described (100) surface, but may be the (010) surface. Since the [001] direction is formed parallel to the main surface of the single-crystal substrate, the electrodes 25A and 25B may be formed on (001) surfaces maximizing remanent polarization.

Further, in the process of FIG. 6A, the PZT film 22 is crystallized by RTA (rapid thermal annealing) processing using, for instance, a halogen lamp annealing apparatus. Specifically, the substrate 21 is placed in the halogen lamp annealing apparatus and is heated at 650° C. for 10 minutes with 5 sccm of oxygen gas being supplied, thereby crystallizing the PZT film 22. The thickness of the crystallized PZT film 22 is set to 80 through 200 nm, for instance, 120 nm. If the thickness of the PZT film 22 does not reach a desired value by a single application of the PZT thin film forming agent and a single crystallization process, the application of the agent and the crystallization process may be repeated. Each application of the agent can grow a PZT film epitaxially on the previously formed PZT film with little effect on the crystallinity of the PZT film 22. As a result of the crystallization of the PZT film 22, the crystallographic relationship between the PZT film 22 and the MgO single-crystal substrate 21 is that the (100) surface of the PZT film 22 // the (100) surface of the MgO substrate 21, and the direction in the film surface is defined as the [001] direction of the PZT film 22 // the [001] direction of the MgO substrate 21.

Further, in the case of forming the PZT film 22 by, for instance, MOCVD, Pb material such as Pb(C$_{11}$H$_{19}$O$_2$)$_2$, Zr material such as Zr(C$_{11}$H$_{19}$O$_2$)$_4$, and Ti material such as Ti(OiC$_3$H$_7$)$_2$ (C$_{11}$H$_{19}$O$_2$)$_2$ are employable. These materials are solid at room temperature. Therefore, the PZT film 22 may be formed by sublimation by setting heating temperature in accordance with the composition of the PZT film 22 and using He as a carrier gas. More commonly, the PZT film 22 is formed by dissolving these materials in an organic solvent such as THF (tetrahydrofuran), transporting the solution to a heated vaporization chamber by a mass flow controller (MFC), and vaporizing the solution instantaneously.

Further, in the process of FIG. 6A, the surface orientation of the PZT film 22 is specified by the crystal orientation of the MgO single-crystal substrate 21, and grinding is performed so as to expose (001) surfaces 22-1 of the PZT film 22. The cube-on-cube epitaxial growth of the PZT film 22 on the MgO single-crystal substrate 21 causes the (001) surface of the MgO single-crystal substrate 21 and the (001) surface of the PZT film 22 to be parallel to each other. Patterning is performed with a resist 23 with reference to the (001) surface of the MgO substrate 21, and the PZT film 22 is ground by wet etching using a nitric acid solution and a hydrofluoric acid solution so that the (001) surfaces 22-1 of the PZT film 22 are exposed.

Next, in the process of FIG. 6B, a resist 24 is formed to cover the structure of FIG. 6A. Openings 24-1 for forming electrodes on the (001) surfaces 22-1 of the PZT film 22 are formed in the resist 24 by patterning.

Further, in the process of FIG. 6B, the electrodes 25A and 25B are formed by depositing any of the above-described electrode materials by spattering. In this case, Ir is deposited as a film so as to form the electrodes 25A and 25B. The thickness of the Ir film is set to 200 nm. Thereby, the ferroelectric capacitor 26 composed of the PZT film 22 and the electrodes 25A and 25B is formed. Before the formation of the Ir film, a film of IrO$_2$ may be formed on-the (001) surfaces 22-1 of the PZT film 22. This prevents the occurrence of a lattice defect such as oxygen deficiency on the surfaces 22-1 of the PZT film 22. As a result, the degradation of the remanent polarization of the PZT film 22 can be prevented so as to increase the number of times the FRAM 20 can rewrite data.

Next, in the process of FIG. 6C, the resist 24 as well as the Ir film 25 formed thereon are lifted off. The interlayer insulating film 27 of a silicon oxide film is formed by CVD using TEOS (Tetraethylorthosilicate) so as to cover the ferroelectric capacitor 26 and the single-crystal substrate 21. The interlayer insulating film 27 is not limited to a silicon oxide film of TEOS, but may be a SiOF film or a BPSG film. However, it is preferable to form the interlayer insulating film 27 by CVD using TEOS or TEOS and ozone. In this case, the interlayer insulating film 27 may be formed at low temperatures with good covering. Therefore, it is possible to provide sufficient covering over the ferroelectric capacitor 26 without causing thermal damage thereto.

Further, in the process of FIG. 6C, a stopper film 28 including a silicon nitride film is formed, and by photolithography and etching, openings 28-1 and 28-2 are formed in the stopper film 28 at a position above the electrode 25A and a position where the via plug 33 is to be formed.

Further, in the process of FIG. 6C, an interlayer insulating film 29 (also shown in FIG. 5) is formed on the surface of the stopper film 28, and a stopper film 30 is formed on the interlayer insulating film 29. A resist 31 is formed on the stopper film 30, and openings 30-1 and 30-2 are formed in the resist 31 and the stopper film 30 by etching such as RIE (reactive ion etching).

Next, in the process of FIG. 6D, the resist 31 of FIG. 6C is removed. With the stopper films 28 and 30 serving as masks, vias 27-1 and 27-2 are formed by RIE so as to penetrate the interlayer insulating films 27 and 29 so that the electrode 25A and the single-crystal substrate 21 are exposed.

Next, in the process of FIG. 6E, an adhesion film 31 of, for instance, TiN is formed by spattering on the surface of the structure of FIG. 6D and the inner walls of the vias 27-1 and 27-2. Then, the vias 27-1 and 27-2 are filled with a conductive material such as W, Cu, or Al by CVD, spattering, or plating, so that the via plugs 32 and 33 are formed.

Further, in the process of FIG. 6E, using the stopper film 30 shown in FIG. 6D as a polishing stopper, the conductive material is polished by CMP to be flattened so that an upper surface 29A of the interlayer insulating film 29 and the surface of the via plugs 32 and 33 are in the same plane. Next, the stopper film 30 is polished with another polishing agent so that the interlayer insulating film 29 is exposed. In terms of electrical connection after the joining of substrates, it is desirable that the surface 29A of the interlayer insulating film 29 be as flat as possible.

Next, in the process of FIG. 6F, in the silicon substrate 41 to serve as the main body of the semiconductor device, the isolation film 42 is formed by STI, and the transistor $T_1$ including the gate electrode 43 as a word line and the source/drain regions 44 and 45 is formed in the device region 47, using a well-known method.

Next, in the process of FIG. 6G, a SiN film 46 is formed over the structure of FIG. 6F, and the interlayer insulating film 48 is formed on the SiN film 46 so as to cover the entire SiN film 46. The interlayer insulating film 48 is formed to have a thickness of 500 nm by CVD using TEOS.

Further, in the process of FIG. 6G, contact holes 49 and 50 are formed in the interlayer insulating film 48 by photolithography and etching so that the source/drain regions 44 and 45 are exposed.

Further, in the process of FIG. 6G, an adhesion film 51 of, for instance, TiN is formed on the surfaces of the contact holes 49 and 50 and the interlayer insulating film 48 by spattering. Then, the contact holes 49 and 50 are filled with a conductive material such as W, Cu, or Al by CVD, spattering, or plating, so that the contact plugs 52 and 53 are formed.

Further, in the process of FIG. 6G, the conductive material is polished by CMP to be flattened so that an upper surface 48A of the interlayer insulating film 48 and the surface of the contact plugs 52 and 53 are in the same plane. In terms of electrical connection after the joining of substrates, it is desirable that the surface 48A of the interlayer insulating film 48 be as flat as possible.

Figure 6H:
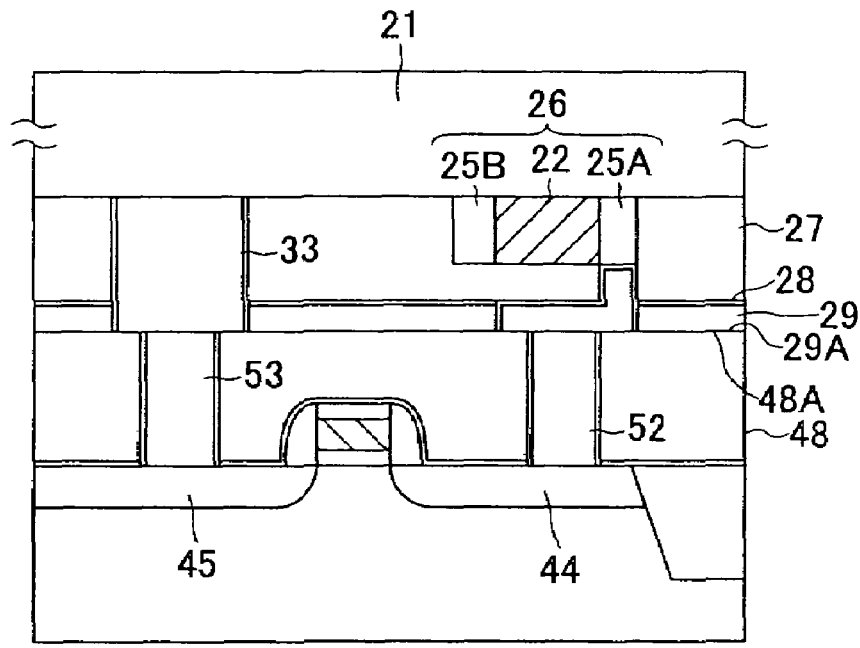

Next, in the process of FIG. 6H, the surface 29A of the interlayer insulating film 29 of a structure 35 of FIG. 6E and the surface 48A of the interlayer insulating film 48 of a structure 55 of FIG. 6G are joined so that the structure 35 of FIG 6E and the structure 55 of FIG. 6G are joined. The structures 35 and 55 may be joined using any of techniques of joining substrates disclosed in Japanese Patent Nos. 2738012 and 2584639, for instance. The single-crystal substrate 21 and the semiconductor substrate 41 are heated at a temperature in the range of 120-450° C. The interlayer insulating films 29 and 48, which are formed of materials of the same type, can be joined easily.

Positioning marks are previously provided to the single-crystal substrate 21 and the semiconductor substrate 41 so that the substrates 21 and 41 are positioned based on the positioning marks at the time of the joining. The substrates 21 and 41 are positioned so that the via plugs 32 and 33 of the structure 35 of FIG. 6E are connected to the contact plugs 52 and 53, respectively, of the structure 55 of FIG. 6G.

Figure 6I:
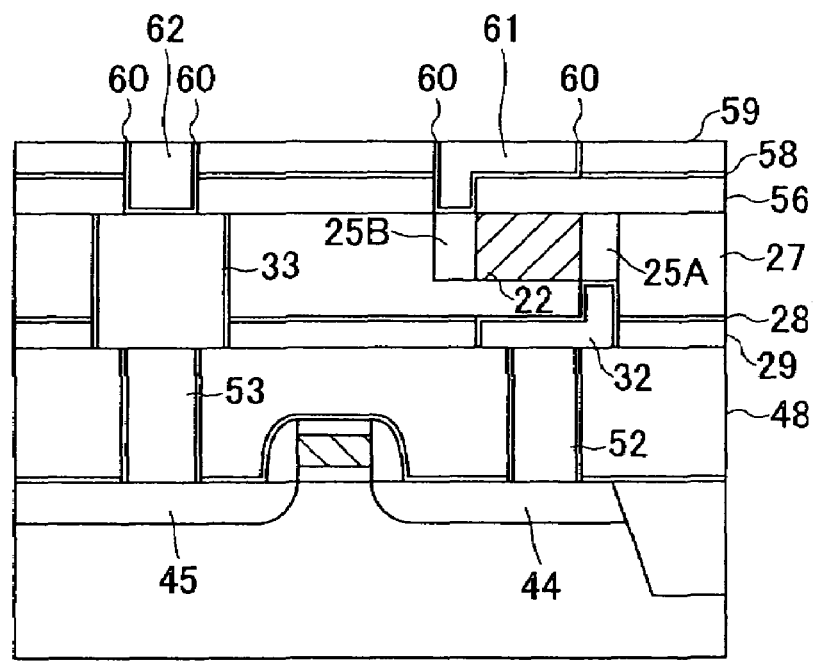

Next, in the process of FIG. 6I, the MgO single-crystal substrate 21 is removed so that the ferroelectric capacitor 26 and the via plug 33 are exposed. Specifically, the MgO substrate 21 is dissolved by dilute hydrochloric acid. If the single-crystal substrate 21 is a Si substrate, the substrate 21 can be dissolved in the same manner. If the substrate 21 is a sapphire substrate, the substrate 21 may be removed mechanically or by CMP.

Further, in the process of FIG. 6I, an interlayer insulating film 56, a stopper film 58, and an interlayer insulating film 59 (also shown in FIG. 5) are formed on the exposed surface of the structure of FIG. 6H after removing the substrate 21 therefrom. Then, in the same manner as in the processes of FIGS. 6D and 6E, the via plugs 61 and 62 are formed so as to be connected to the electrode 25B and the via plug 33, respectively, with an adhesion film 60 of a TiN film being formed on the boundary between the via plugs 61 and 62 and the interlayer insulating films 56 and 59.

Figure 6J:
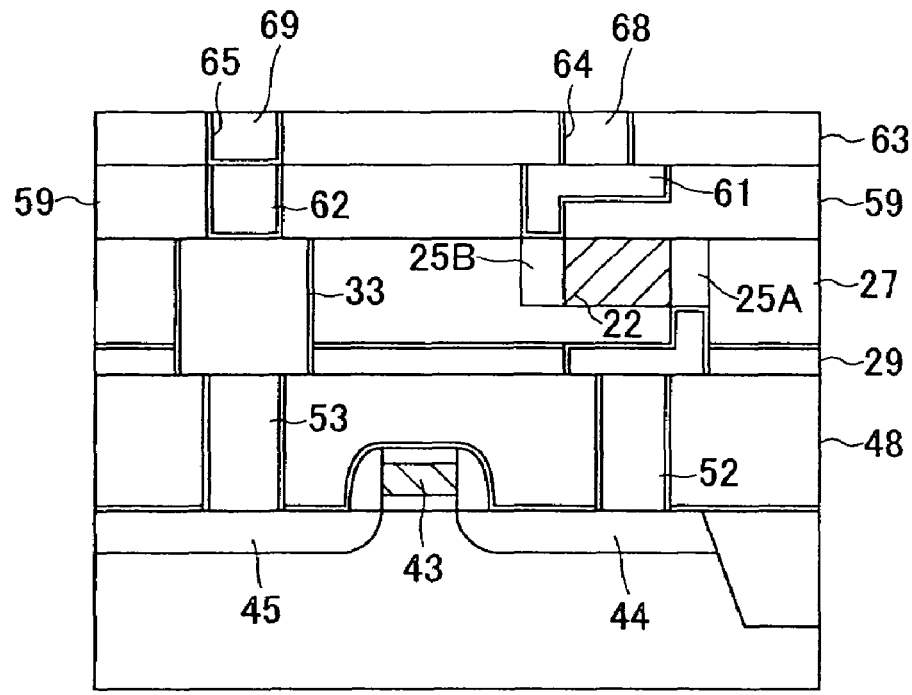

Next, in the process of FIG. 6J, an interlayer insulating film 63 (also shown in FIG. 5) is formed on the structure of FIG. 6I. By photolithography and etching, a groove 64 for a planar line is formed on the via plug 61 and a via 65 is formed on the via plug 62 in the interlayer insulating film 63. A conductive material such as W is provided over the interlayer insulating film 63, filling the groove 64 and the via 65. The conductive material is polished by CMP so that the interlayer insulating film 63 is exposed. As a result, the via plugs 68 and 69 are formed.

Figure 6K:
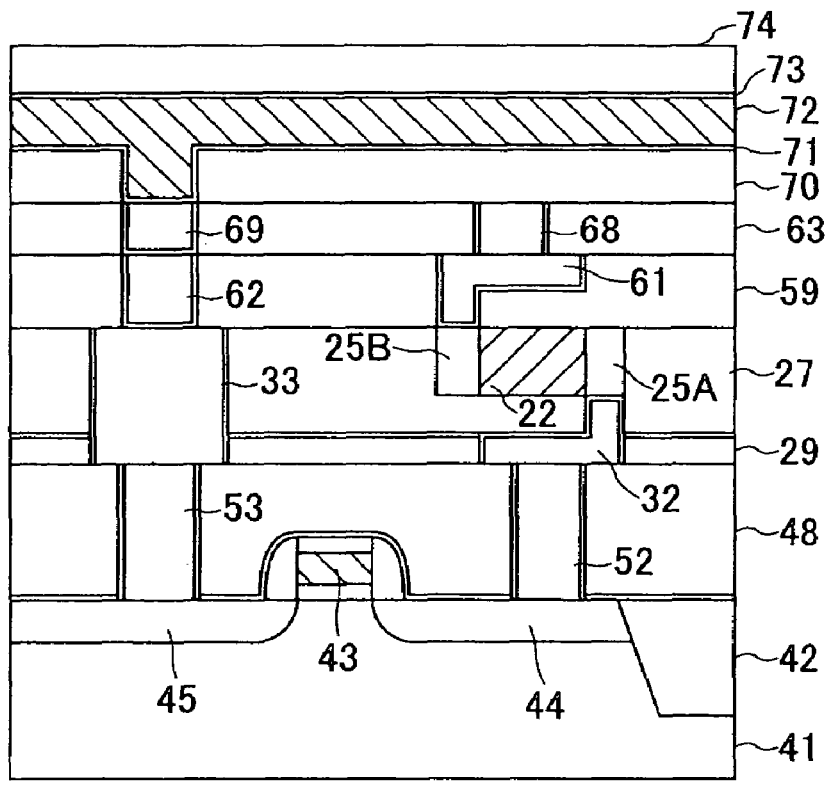

Next, in the process of FIG. 6K, the interlayer insulating film 70 is formed on the structure of FIG. 6J. The bit line 72 is formed by the damascene method so as to be connected to the source/drain region 45 through the via plugs 69, 62, and 33 and the contact plug 53. Further, a protection film 74 is formed on the surfaces of the bit line 72 and the interlayer insulating film 70. Thereby, the FRAM 20 of FIG. 5 according to the embodiment is formed. Reference numerals 71 and 73 denote diffusion barrier films that also function as adhesion films.

Next, a description is given of a first variation of the embodiment of the present invention. The first variation is different from the above-described embodiment only in that the single-crystal substrate on which a ferroelectric film is formed is a layered structure.

Figure 7:
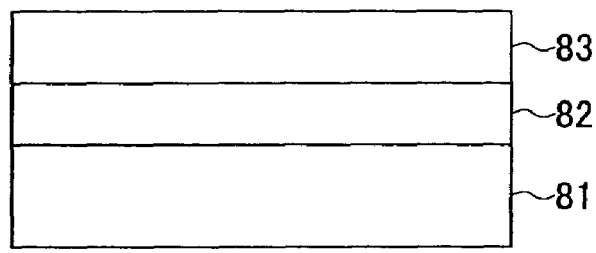
FIG. 7 is a sectional view of a layered structure in which a ferroelectric film is formed according to a first variation of the embodiment of the present invention.

FIG. 7 is a sectional view of a layered structure 80 in which a ferroelectric film 83 is formed according to the first variation of the embodiment. Referring to FIG. 7, a buffer layer 82 and the ferroelectric film 83 are successively stacked on a silicon single-crystal substrate 81 whose main surface is the (100) or (010) surface, thereby forming the layered structure 80. The buffer layer 82 is epitaxially grown on the silicon single-crystal substrate 81, and the ferroelectric film 83 is epitaxially grown on the buffer layer 82.

The buffer layer 82 is formed of a MgO layer, an yttrium-stabilized $ZrO_2$ layer (YSZ), a $SrTiO_3$ layer, a magnesia spinel ($MgAl_2O_4$) layer, or a CaO layer. When the buffer layer 82 is formed on the (100) surface of the silicon single-crystal substrate 81, the (100) surface of the buffer layer 82 grows. When the buffer layer 82 is formed on the (010) surface of the silicon single-crystal substrate 81, the (010) surface of the buffer layer 82 grows. The buffer layer 82 is grown to have a thickness of 30-800 nm by MBE, CVD, or spattering. Specifically, in the case of forming a $MgAl_2O_4$ layer by CVD, for instance, the composition elements of the $MgAl_2O_4$ layer are heated and vaporized in their respective source chambers, and are supplied into a film-forming chamber by a carrier gas. The single-crystal substrate 81 is heated to 750-1050° C. The deposition rate is set to 5-30 nm/min, and the $MgAl_2O_4$ layer is formed to have a thickness of 80-600 nm.

The ferroelectric film 83 can be formed on the buffer layer 82 by MOCVD, MBE, PLD, or the sol-gel method described above in the embodiment of the present invention. The details of the formation method are the same, and a description thereof is omitted. When the ferroelectric film 83 is formed on the (100) surface of the buffer layer 82, the (100) surface of the ferroelectric film 83 grows epitaxially. When the ferroelectric film 83 is formed on the (010) surface of the buffer layer 82, the (010) surface of the ferroelectric film 83 grows epitaxially. Accordingly, in each case, the [001] direction, which is the direction of the polarization axis of the ferroelectric film 83, is parallel to the single-crystal substrate 81. In order to form a ferroelectric capacitor, the surface orientation of the ferroelectric film 83 may be specified so as to expose (001) surfaces thereof, and electrodes may be formed on the exposed (001) surfaces.

According to the first variation, a silicon substrate is employed as the single-crystal substrate 81. Therefore, a large-size single-crystal substrate of 300 mm in diameter is available at a low price. As a result, the semiconductor device can be manufactured at reduced costs.

A silicon single-crystal substrate having an inclination with an offset angle (a vicinal substrate) may be employed. In the case of a silicon single-crystal substrate with no offset angle, upward and downward steps due to minute unevenness may exist when viewing a section of the substrate taken in one direction. When a buffer layer is epitaxially grown on the surface of such a substrate, the atomic layers are formed sideways on the upward and downward steps so as to collide with each other, thus generating a grain boundary. In the case of employing a vicinal substrate, however, no such phenomenon occurs. Accordingly, crystals of better quality may be obtained. This is also the case with the crystallinity (crystal quality) of the ferroelectric film 83 formed on the buffer layer 82. The better the crystallinity of the buffer layer 82, the better the crystallinity of the ferroelectric film 83. In terms of crystallinity, the offset angle is preferably in the range of 0.8-4 degrees.

Next, a description is given of a second variation of the embodiment of the present invention. The second variation is different from the first variation only in that another buffer layer 85 is additionally formed between the buffer layer 82 and the ferroelectric film 83.

Figure 8:
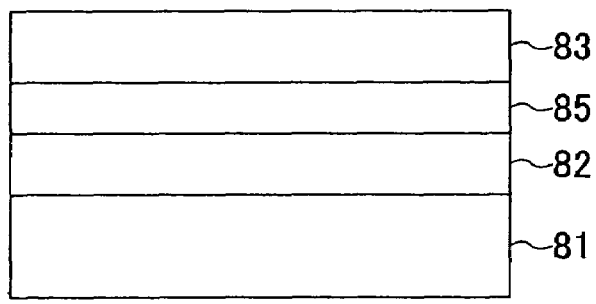
FIG. 8 is a sectional view of a layered structure in which the ferroelectric film is formed according to a second variation of the embodiment of the present invention.

FIG. 8 is a sectional view of a layered structure 84 in which the ferroelectric film 83 is formed according to the second variation. In FIG. 8, the same elements as those previously described are referred to by the same numerals, and a description thereof is omitted.

Referring to FIG. 8, the buffer layer 82, the buffer layer 85, and the ferroelectric film 83 are successively stacked on the silicon single-crystal substrate 81 whose main surface is the (100) or (010) surface, thereby forming the layered structure 84. The buffer layer 82 is epitaxially grown on the silicon single-crystal substrate 81, the buffer layer 85 is epitaxially grown on the buffer layer 82, and the ferroelectric film 83 is epitaxially grown on the buffer layer 85.

As the buffer layer 85, a $SrRuO_3$, $YBa_2Cu_3O_{7-\delta}$ (YBCO), or $La_{2-x}Sr_xCuO_4$ (LSCO) layer of 60-240 nm in thickness is employable. The buffer layer 85 is formable in the same manner as the buffer layer 82. The formation of the buffer layer 85 reduces the difference in lattice constant between the buffer layer 82 and the ferroelectric film 83. As a result, the ferroelectric film 83 may be formed with better crystallinity.

Next, a description is given of a third variation of the embodiment of the present invention. The third variation is different from the above-described embodiment only in that the ferroelectric capacitor 26 is replaced with a ferroelectric capacitor 86 formed of a plurality of ferroelectric capacitors connected in parallel.

Figure 9A:
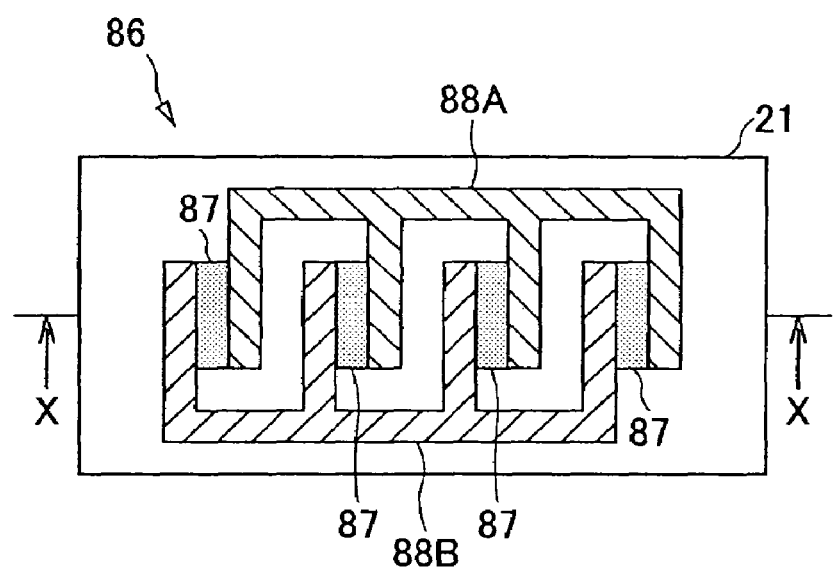
FIG. 9A is a plan view of a ferroelectric capacitor and FIG. 9B is a sectional view of the ferroelectric capacitor of FIG. 9A taken along the line X-X according to a third variation of the embodiment of the present invention
Figure 9B:
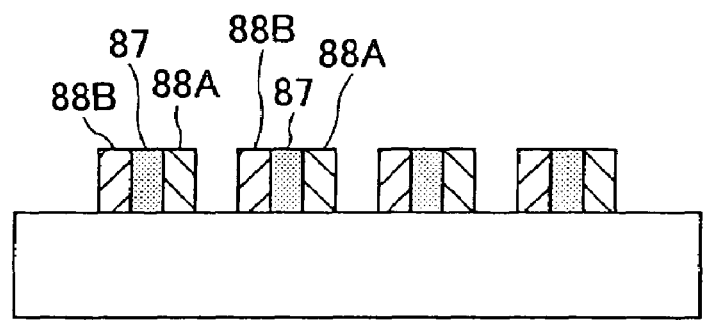

FIG. 9A is a plan view of the ferroelectric capacitor 86 according to the third variation. FIG. 9B is a sectional view of the ferroelectric capacitor 86 of FIG. 9A taken along the line X-X.

Referring to FIG. 9A, ferroelectric films 87 are sandwiched between electrodes 88A and 88B on the single-crystal substrate 21 so that four parallel-plate ferroelectric capacitors are connected in parallel to form the ferroelectric capacitor 86.

The ferroelectric films 87 and the electrodes 88A and 88B are formable by changing the patterning of the resists 23 and 24 in the processes of FIGS. 6A and 6B. The other processes are the same as in the above-described embodiment.

According to the third variation, the ferroelectric capacitor 86 is formed of ferroelectric capacitors connected in parallel. Accordingly, the total remanent polarization can be increased so that the same charge can be obtained with a reduced operating voltage. Simultaneously, a semiconductor device with reduced power consumption and high reliability can be formed.

Thus, according to the present invention, in a capacitor, electrodes are provided perpendicular to the direction of the polarization axis of a ferroelectric film sandwiched between the electrodes. Accordingly, a greater remanent polarization charge may be obtained.

The electrodes may be plates and provided parallel to each other so as to ensure that the charge of the maximum remanent polarization of the ferroelectric film is obtained.

A semiconductor device including such a capacitor has tolerance for the degradation of the remanent polarization charge and has a high signal-to-noise ratio at the time of reading out information. Accordingly, the reliability of the semiconductor device can be increased.

Further, according to the present invention, the ferroelectric film may be an epitaxial film. Generally, the epitaxial film is formed on a single-crystal substrate with the same orientation relationship as the crystals of the substrate. Accordingly, the epitaxial film has not only crystalline orientation in the direction in which it grows but also crystalline orientation of an in-plane direction.

Further, according to the present invention, since the ferroelectric film of the capacitor is formed on a single-crystal substrate, the ferroelectric film may be formed epitaxially thereon. Therefore, the ferroelectric film can be formed with excellent crystalline quality with a fixed crystal orientation. Further, in the semiconductor device, the capacitor is formed in a process independent of a process of forming the transistor. Accordingly, a wide range of tolerance can be set for the conditions for forming the capacitor, such as a temperature condition, so that the ferroelectric film may be formed with better crystallinity. As a result, the reliability of the semiconductor device can be increased.

Further, according to the present invention, a buffer layer may be formed between a silicon single-crystal substrate and the ferroelectric film. The formation of the buffer layer reduces the lattice mismatching between the ferroelectric film and the silicon substrate. As a result, the ferroelectric film can be grown epitaxially with better crystallinity.

The present invention is not limited to the specifically disclosed embodiment, and variations and modifications may be made without departing from the scope of the present invention. For instance, each of the first and second variations may be combined with the third variation.

What is claimed is:

1. A capacitor, comprising:
   a pair of electrodes; and
   a ferroelectric film sandwiched between the electrodes,
   wherein the electrodes are provided perpendicular to a direction of a polarization axis of the ferroelectric film;
   the electrodes are provided on corresponding opposing (001) crystallographic surfaces of the ferroelectric film, the corresponding opposing (001) crystallographic surfaces being parallel to a direction of growth of the ferroelectric film;
   the ferroelectric film comprises PZT or a material formed by adding La, Ca, Sr or Nb to PZT; and
   wherein a top surface of the ferroelectric film is a (100) crystallographic surface.

2. The capacitor as claimed in claim 1, wherein the electrodes are plates and substantially parallel to each other.

3. The capacitor as claimed in claim 1, wherein the ferroelectric film is an epitaxial film.

4. The capacitor as claimed in claim 1, wherein the electrodes comprise one of Pt, Ir, Ti, Ru, and oxides thereof.

5. A semiconductor device, comprising:
a semiconductor substrate; and
a capacitor provided on the semiconductor substrate, the capacitor including a pair of electrodes and a ferroelectric film sandwiched therebetween,
wherein the electrodes are provided perpendicular to a direction of a polarization axis of the ferroelectric film;
the electrodes are provided on corresponding opposing (001) crystallographic surfaces of the ferroelectric film, the corresponding opposing (001) crystallographic surfaces being perpendicular to a surface of the semiconductor substrate on which the capacitor is provided;
the ferroelectric film comprises PZT or a material formed by adding La, Ca, Sr or Nb to PZL; and
wherein a top surface of the ferroelectric film is a (100) crystallographic surface.

6. The semiconductor device as claimed in claim 5, wherein the direction of the polarization axis of the ferroelectric film is substantially parallel to a main surface of the semiconductor substrate.

7. The semiconductor device as claimed in claim 5, wherein the ferroelectric film is an epitaxial film.

8. A semiconductor device, comprising:
a semiconductor substrate; and
a capacitor provided on the semiconductor substrate, the capacitor including a pair of electrodes and a ferroelectric film sandwiched therebetween,
wherein the electrodes are provided on corresponding opposing (001) crystallographic surfaces of the ferroelectric film, the corresponding opposing (001) crystallographic surfaces being perpendicular to a surface of the semiconductor substrate on which the capacitor is provided;
the ferroelectric film comprises PZT or a material formed by adding La, Ca, Sr or Nb to PZT; and
wherein a top surface of the ferroelectric film is a (100) crystallographic surface.

* * * * *